(12) United States Patent
Byrne et al.

(10) Patent No.: US 10,425,236 B2
(45) Date of Patent: Sep. 24, 2019

(54) INTELLIGENT ELECTRICAL POWER DISTRIBUTION SYSTEM

(71) Applicants: Norman R. Byrne, Ada, MI (US); Peter J. Maher, Grand Rapids, MI (US)

(72) Inventors: Norman R. Byrne, Ada, MI (US); Peter J. Maher, Grand Rapids, MI (US)

(*) Notice: Subject to any disclaimer, the term of this patent is extended or adjusted under 35 U.S.C. 154(b) by 144 days.

(21) Appl. No.: 15/723,816

(22) Filed: Oct. 3, 2017

(65) Prior Publication Data

US 2018/0097641 A1    Apr. 5, 2018

Related U.S. Application Data

(60) Provisional application No. 62/404,440, filed on Oct. 5, 2016.

(51) Int. Cl.

| | |
|---|---|
| *H04L 12/10* | (2006.01) |
| *H02H 3/04* | (2006.01) |
| *G05B 15/02* | (2006.01) |
| *H05B 37/02* | (2006.01) |
| *G01R 31/382* | (2019.01) |
| *H02J 1/00* | (2006.01) |
| *G01R 31/44* | (2006.01) |

(52) U.S. Cl.
CPC ............ *H04L 12/10* (2013.01); *G01R 31/382* (2019.01); *G01R 31/44* (2013.01); *G05B 15/02* (2013.01); *H02H 3/04* (2013.01); *H02J 1/00* (2013.01); *H05B 37/0209* (2013.01); *Y02D 50/30* (2018.01)

(58) Field of Classification Search
CPC .................................. H04L 12/10; H02J 1/00
USPC ......................................................... 307/116
See application file for complete search history.

(56) References Cited

U.S. PATENT DOCUMENTS

| | | |
|---|---|---|
| 1,333,003 A | 3/1920 | Titus |
| 2,094,681 A | 10/1937 | Sears |
| 2,157,527 A | 5/1939 | Clarke et al. |
| 3,049,688 A | 8/1959 | Sinopoli |
| 3,297,886 A | 1/1967 | Danner |
| 3,585,569 A | 6/1971 | Moran |
| 3,598,900 A | 8/1971 | Drake |
| 3,984,622 A | 10/1976 | Ross |
| 4,099,824 A | 7/1978 | Schoppelrey |
| 4,399,371 A | 8/1983 | Ziff et al. |

(Continued)

*Primary Examiner* — Adi Amrany
(74) *Attorney, Agent, or Firm* — Gardner, Linn, Burkhart & Ondersma LLP

(57) ABSTRACT

An electrical power and data system for group seating arrangements includes a DC power supply for converting an AC voltage input to a DC low voltage output, a low voltage main line and at least one branch line with a power output in communication with the DC output, and an occupancy sensor at a seating area for generating an occupancy signal. The power output of the branch line positionable at the seating area, and configured to supply power to a portable electronic communications device. A switch energizes and de-energizes the electrical power output in response to the occupancy signal, and the branch line, main line, and DC power supply cooperate to provide electronic communications between the portable electronic device and the electronic data network when the DC power supply is energized.

20 Claims, 5 Drawing Sheets

(56) References Cited

U.S. PATENT DOCUMENTS

| | | |
|---|---|---|
| 4,434,377 A | 2/1984 | Shima et al. |
| 5,234,360 A | 8/1993 | Kramer, Jr. |
| 5,236,374 A | 8/1993 | Leonard et al. |
| 5,238,424 A | 8/1993 | Vindum |
| 5,275,574 A | 1/1994 | Schlothauer et al. |
| 5,283,392 A | 2/1994 | Ooshima et al. |
| 5,414,212 A | 5/1995 | Clouet et al. |
| 5,518,214 A | 5/1996 | Spencer |
| 5,547,399 A | 8/1996 | Naghi et al. |
| 5,575,668 A | 11/1996 | Timmerman |
| 5,606,150 A | 2/1997 | Radliff et al. |
| 5,616,968 A | 4/1997 | Fujii et al. |
| 5,676,563 A | 10/1997 | Kondo et al. |
| 5,902,148 A | 5/1999 | O'Rourke |
| 5,957,714 A | 9/1999 | Johnson et al. |
| 6,028,267 A | 2/2000 | Byrne |
| 6,133,845 A | 10/2000 | Toms et al. |
| 6,179,381 B1* | 1/2001 | Gevaert ............... A47C 7/72 297/217.3 |
| 6,207,894 B1 | 3/2001 | Reiker |
| 6,257,923 B1 | 7/2001 | Stone et al. |
| 6,259,027 B1 | 7/2001 | Watanabe |
| 6,281,434 B1 | 8/2001 | Gretz |
| 6,281,439 B1 | 8/2001 | Reiker |
| 6,290,518 B1 | 9/2001 | Byrne |
| 6,362,987 B1 | 3/2002 | Yurek et al. |
| 6,486,407 B1 | 11/2002 | Hawker et al. |
| 6,573,617 B2 | 6/2003 | Jones et al. |
| 6,746,273 B1 | 6/2004 | Liu et al. |
| 6,767,255 B1 | 7/2004 | Croswell |
| 6,786,765 B2 | 9/2004 | Bauermeister et al. |
| 6,805,579 B2 | 10/2004 | Marchand et al. |
| 7,057,108 B1 | 6/2006 | Sodemann et al. |
| 7,066,616 B2 | 6/2006 | Howell |
| 7,210,960 B2 | 5/2007 | Mak |
| 7,229,302 B1 | 6/2007 | Lai |
| 7,282,645 B2 | 10/2007 | Locke |
| 7,285,021 B2 | 10/2007 | Bell et al. |
| 7,467,967 B2 | 12/2008 | Kuo |
| 7,511,226 B2 | 3/2009 | Fahey |
| 7,537,485 B2 | 5/2009 | Bell et al. |
| 7,591,673 B2 | 9/2009 | Chan et al. |
| D604,253 S | 11/2009 | Andre et al. |
| 7,614,911 B2 | 11/2009 | Hsieh et al. |
| 7,624,503 B2 | 12/2009 | Fukuda |
| 7,642,671 B2 | 1/2010 | Mahaffey |
| D613,248 S | 4/2010 | Wu |
| 7,751,206 B2 | 7/2010 | Kosacek et al. |
| 7,878,845 B2 | 2/2011 | Byrne |
| 7,938,682 B2 | 5/2011 | Su |
| 8,003,888 B2 | 8/2011 | Owen, Sr. |
| 8,004,115 B2 | 8/2011 | Chapel et al. |
| 8,029,307 B2 | 10/2011 | O'Rourke |
| 8,116,940 B2 | 2/2012 | Keller |
| 8,235,746 B2 | 8/2012 | He |
| 8,350,406 B2 | 1/2013 | Byrne et al. |
| 8,429,435 B1* | 4/2013 | Clayton ............... H04L 12/10 700/19 |
| 8,464,982 B2 | 6/2013 | Raybell et al. |
| 8,574,010 B2 | 11/2013 | Wu |
| 8,604,342 B2 | 12/2013 | Solon |
| 8,608,505 B2 | 12/2013 | Mantay et al. |
| 8,653,365 B1 | 2/2014 | Mixon |
| 9,531,145 B2 | 12/2016 | Byrne et al. |
| 9,652,014 B2* | 5/2017 | Warwick ............... G06F 1/32 |
| 9,893,482 B2 | 2/2018 | Byrne et al. |
| 10,070,736 B2 | 9/2018 | Byrne et al. |
| 10,175,996 B2 | 1/2019 | Byrne et al. |
| 2002/0189841 A1 | 12/2002 | Patterson |
| 2002/0195523 A1 | 12/2002 | Cawley |
| 2004/0050573 A1 | 3/2004 | Lin et al. |
| 2004/0182170 A1 | 9/2004 | Harju |
| 2004/0256135 A1 | 12/2004 | Liu |
| 2005/0011657 A1 | 1/2005 | Johnston et al. |
| 2005/0021602 A1* | 1/2005 | Noel ............... H04B 7/18506 709/203 |
| 2006/0019532 A1 | 1/2006 | Kiss, Jr. |
| 2008/0012423 A1 | 1/2008 | Mimran |
| 2008/0140565 A1 | 6/2008 | DeBenedetti et al. |
| 2008/0196936 A1 | 8/2008 | Yamamoto et al. |
| 2009/0053926 A1 | 2/2009 | Johnson et al. |
| 2010/0090851 A1 | 4/2010 | Hauser |
| 2010/0139733 A1 | 6/2010 | Jonczyk et al. |
| 2010/0201201 A1 | 8/2010 | Mobarhan et al. |
| 2011/0079682 A1* | 4/2011 | Raybell ............... B64D 11/06 244/122 R |
| 2012/0028488 A1 | 2/2012 | Puschnigg et al. |
| 2012/0295473 A1 | 11/2012 | Chen |
| 2012/0295483 A1* | 11/2012 | Smed ............... H01R 9/2408 439/620.21 |
| 2013/0244463 A1 | 9/2013 | Talavasek et al. |
| 2014/0041935 A1 | 2/2014 | Solon |
| 2014/0076628 A1 | 3/2014 | McGrath et al. |
| 2015/0021964 A1* | 1/2015 | Jacobs ............... A47C 1/126 297/232 |
| 2016/0218517 A1* | 7/2016 | Rittner ............... B64D 11/0624 |
| 2017/0316659 A1 | 11/2017 | Byrne et al. |
| 2018/0102632 A1 | 4/2018 | Byrne et al. |
| 2018/0177300 A1* | 6/2018 | Jacobs ............... A47C 4/06 |

* cited by examiner

INTELLIGENT ELECTRICAL POWER DISTRIBUTION SYSTEM

CROSS REFERENCE TO RELATED APPLICATION

The present application claims the filing benefits of U.S. provisional application Ser. No. 62/404,440, filed Oct. 5, 2016, which is hereby incorporated by reference herein in its entirety.

FIELD OF THE INVENTION

The present invention relates to electrical power and data systems that are mountable in group seating areas such as theaters, arenas, stadiums, public transit stations, or transportation vehicles.

BACKGROUND OF THE INVENTION

The need or desire to incorporate electrical power outlets in different locations has increased as portable electronic devices such as mobile phones, tablet computers, and handheld electronic media players have proliferated, since these devices often require frequent charging of onboard batteries. Such devices typically require access to high voltage (e.g., 110V AC or 220V AC) power outlets, in which case a DC power converter is generally required, or direct access to a low voltage (e.g. 2V DC to 12V DC) power outlet.

SUMMARY OF THE INVENTION

The present invention provides an electrical power and data system for supplying electrical charging power to the portable electronic communications devices of users in a group seating area, and for exchanging electronic data between the connected portable devices and the electronic data network(s) associated with a venue or vehicle in which the group seating area is located. Optionally, the electrical power and data system may be provided with some limited control of connected devices, such as disabling ringers and switching to vibration or visual notification features, such as for use in movie theaters or performance venues. By using occupancy sensors such as seat pressure sensors, charging capability is provided on-demand such as on a seat-by-seat basis, or on a group or section basis, or both. This reduces useless energy consumption, sometimes called "vampire power," by only energizing circuits that are actually in use or associated with seating that is actually in use. In addition, electronic data communications between a user's portable electronic communications device and the electronic data network of the building, venue, or vehicle in which the system and device are located, permit the exchange of useful information between each user's device and the electronic data network.

In one form of the present invention, an electrical power and data system is provided for group seating arrangements in a venue such as an entertainment venue or eating establishment, or in a vehicle such as a commercial aircraft or bus. The power and data system includes a DC power supply, which may be capable of converting an AC voltage input to a DC low voltage output, a low voltage main line and at least one branch line, and an occupancy sensor at a seating area for generating an occupancy signal. A low voltage main line and at least one branch line convey electrical power, and optionally also electronic data signals, between a power output (e.g., direct-contact receptacle or wireless power transmitter) at the seating area, and the DC power supply. A switch energizes and de-energizes the electrical power output in response to the occupancy signal, and the branch line, main line, and DC power supply cooperate to provide electronic communications between the portable electronic device and the electronic data network when the DC power supply is energized.

In another form of the present invention, an electrical power and data system for a group seating area includes an electrical power supply, a plurality of occupancy sensors, a main power line, a plurality of branch power lines electrically coupled to the main power line, and a controller in communication with the occupancy sensors and with an electronic data network associated with the group seating area. The occupancy sensors are positionable at respective seats in the group seating area, and are operable to generate respective occupancy signals that are indicative of the occupancy status of the seats. The main power line includes at least two electrical power conductors and has a power input end electrically coupled to the electrical power supply and a downstream end opposite the power input end. Each of the branch power lines has an electrical power output for supplying electrical power to a portable electronic communications device. The electrical power outputs are positionable in the seating area and are accessible from at least one of the seats. The controller includes a switch that is operable to selectively energize one or more of the electrical power outputs in response to receiving one or more occupancy signal. Moreover, the controller is operable to establish two-way electronic communications between one or more of the portable electronic communications devices and the electronic data network in response to the one or more portable electronic communications devices receiving electrical power from a respective one or more of the electrical power outputs.

According to one aspect, the branch power line and the main power line are both able to provide the two-way electronic communications between one or more of the portable electronic communications devices and the electronic data network. Optionally, the branch power line and the main power line each include an electronic signal line for providing the two-way electronic communications between one or more of the portable electronic communications devices and the electronic data network. For example, the electronic signal line may be a twisted pair of electronic data conductors or a fiber optic line.

According to another aspect, the electrical power supply is a low voltage DC power supply, which is operable to receive an AC voltage input and to convert the AC voltage input to a DC low voltage output.

According to yet another aspect, the electrical power outputs are direct-contact electrical receptacles each configured to be engaged by an electrical plug associated with the portable electronic device.

According to still another aspect, the direct-contact electrical receptacles include electronic data interfaces that can be engaged by a corresponding electronic data interface of the electrical plug associated with the portable electronic device.

Optionally, the electrical power outputs include respective voltage reduction circuits operable to receive a first voltage from the branch line and to output a second voltage that is lower than the first voltage to the direct-contact electrical receptacles.

According to a further aspect, the electrical power output includes the switch and the controller, and wherein the controller is in wireless electronic communication with the occupancy sensor.

According to a still further aspect, the electrical power supply includes the controller and the switch, the switch being operable to energize and de-energize the main power line.

According to another aspect, the occupancy sensor is a seat pressure sensor or a seat angle sensor.

According to still another aspect, each of the electrical power outputs of each of the branch lines is in wireless electronic communication with a respective one of the occupancy sensors, and the electrical power outputs are selectively individually energized in response to the occupancy signal received from the respective one of the occupancy sensors. Optionally, the electrical power outputs are de-energized in response to a predetermined amount of lapsed time after a respective one of the occupancy signals was last received from the respective one of the occupancy sensors.

In still another form of the present invention, a method is provided for electrically charging portable electronic communications devices and establishing two-way electronic communications between the portable electronic communications devices and an electronic data network in a group seating area. The method includes the steps of (i) positioning one of the portable electronic communications devices so as to be capable of receiving electrical charging power from an electrical power output associated with a seat in the group seating area, (ii) detecting seat occupancy with an occupancy sensor disposed in the seat in the group seating area, wherein the occupancy sensor is operable to detect seat pressure and/or seat angle, (iii) generating an occupancy signal with the occupancy sensor upon the detecting seat occupancy, (iv) receiving the occupancy signal with a controller associated with at least one of the electrical power output and an electrical power supply, the electrical power supply being operable to supply electrical power to the electrical power output via a main power line and a branch power line corresponding to the seat and in electrical communication with the main power line, (v) electrically energizing the electrical power output in response to the receiving the occupancy signal to thereby provide the electrical charging power to the portable electronic communications device, and (v) establishing two-way electronic communications between the portable electronic communications device and the electronic data network in response to the receiving the occupancy signal and the electrically energizing the electrical power output.

Accordingly, the electrical power and data system of the present invention can be installed in substantially any group seating area, such as a work area, a transportation vehicle, or an entertainment venue, and provides both electrical charging power to individual users' portable electronic communications devices (e.g. smart phones, hand-held or laptop computers, etc.), on an as-needed basis. Seat occupancy sensors are used to determine space utilization and to selectively energize and/or establish two-way communications with the users' communications devices. Two-way electronic data communications may be used to provide useful information via the portable electronic devices, to control certain functions of the devices, and/or to collect information about seat utilization and power consumption.

These and other objects, advantages, purposes and features of the present invention will become apparent upon review of the following specification in conjunction with the drawings.

DESCRIPTION OF THE PREFERRED EMBODIMENTS

Figure 1:
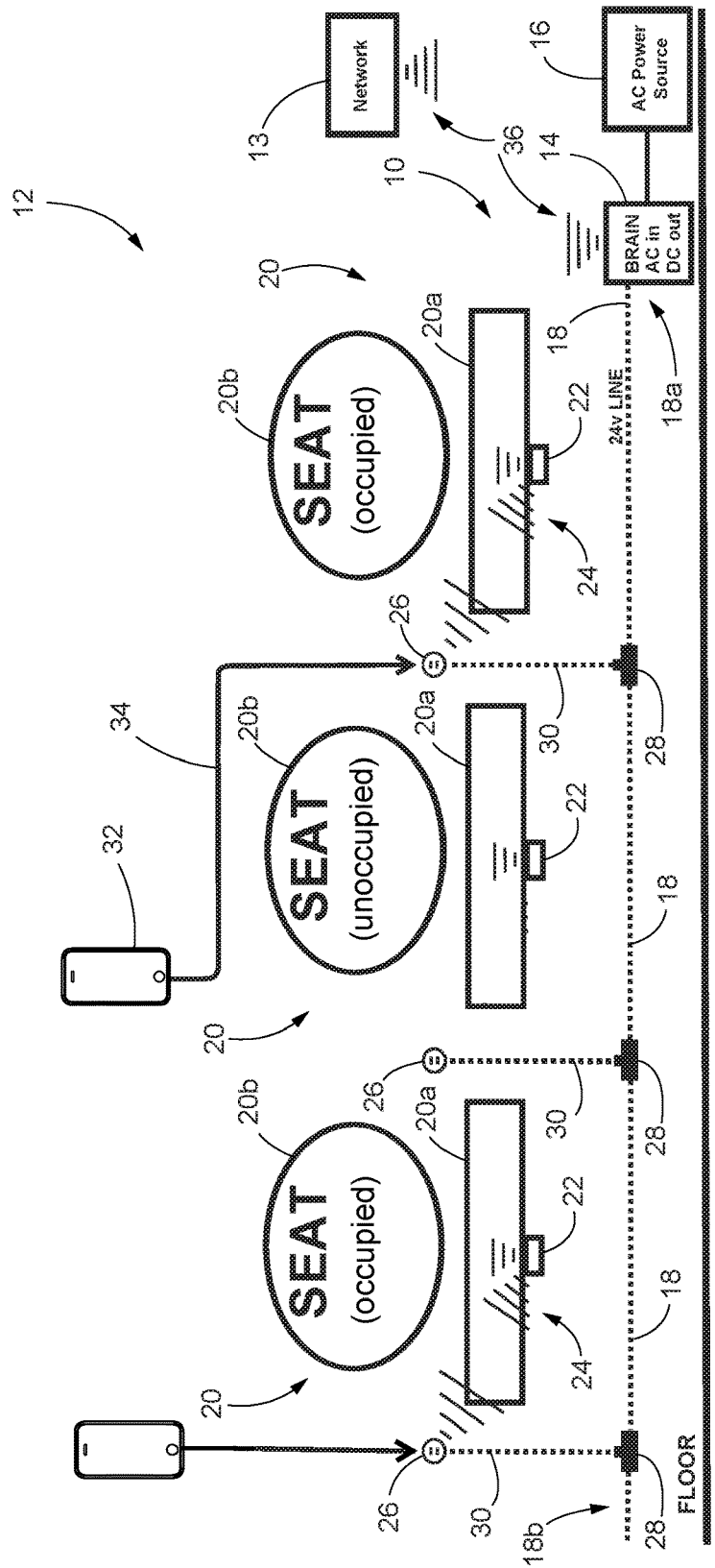
FIG. 1 is a diagrammatic view of an electrical power and data system in a group seating area, in accordance with the present invention.

Referring now to the drawing and the illustrative embodiment depicted therein, an electrical power and data system 10 is adapted for installation in a group seating area 12 (FIG. 1), such as in theaters, arenas, stadiums, public transit stations, transportation vehicles, and the like. Electrical power and data system 10 permits electrical charging of portable electronic devices, such as handheld mobile phones and computing devices, tablet computers, etc., while reducing energy losses due to electrically energized but unused power outlets, including low voltage DC outlets. Optionally, the system establishes wireless or wired electronic communications between connected portable electronic devices and an electronic data network 13 associated with the group seating area, such as using BACnet protocol, which is a standard electronic communications protocol used for building automation and control networks.

Electrical power and data system 10 includes a combination DC power supply and controller 14 that receives an AC power input from an AC power source 16, such as from a building's electrical system, and converts the AC voltage input to a DC low voltage output to a low voltage main line 18. However, it will be appreciated that the electrical systems in vehicles are more likely to be low voltage DC electrical systems that would not require an AC-to-DC power converter. DC power supply 14 may include a switch that is operable to selectively energize and de-energize main line 18, and may be in communication with electronic data network 13 that is associated with the building or vehicle in which the seating area 12 is located, as described in more detail below.

In the illustrated embodiment of FIG. 1, seating area 12 includes three individual seats 20, each having a seat bottom 20a fitted with an occupancy sensor 22 that is operable to generate an occupancy signal 24 when occupancy sensor 22 detects that a person is supported on the seat 20. In FIG. 1 the left and right seats are illustrated as "occupied" while the middle seat is illustrated as "unoccupied". Occupancy signals 24 may be directed to and received by controllers (not shown) that are directly associated with respective electrical power outputs 26, which in turn are associated with the respective seats 20 or with DC power supply 14, or both, as will be described below. Occupancy sensor 22 may be a pressure or load sensor switch 27 (FIG. 5), such as one of the various types of sensors commonly used in automotive seats to detect the presence and/or approximate weight and/or position of a passenger. Occupancy sensors 22 may be self-contained units with lifetime batteries and wireless short-range communications capability, such as near field communications (NFC) or BLUETOOTH® Low Energy (BLE) communications.

Figure 2A:
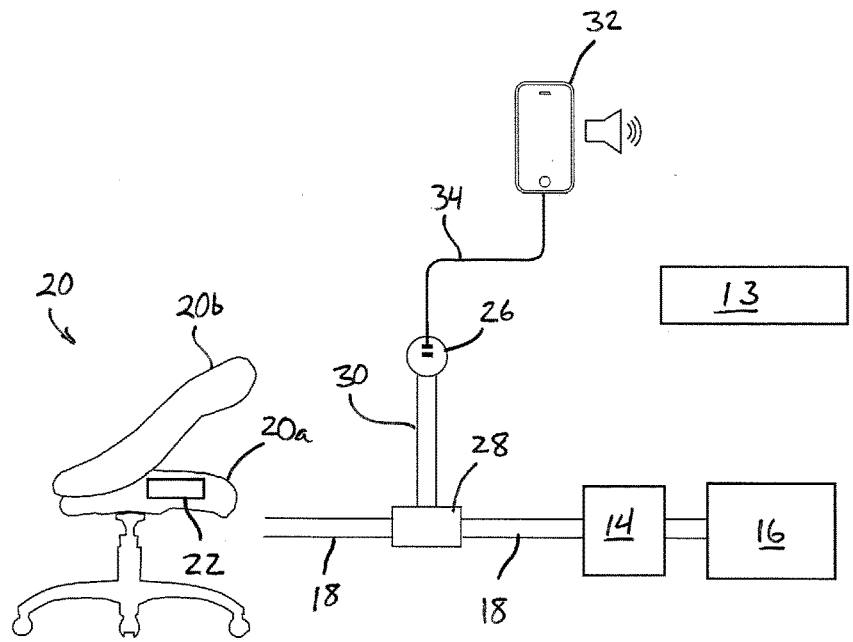
FIGS. 2A and 2B are diagrammatic views of a portion of the electrical power and data system of FIG. 1, shown in unoccupied and occupied modes with a single portable chair.
Figure 2B:
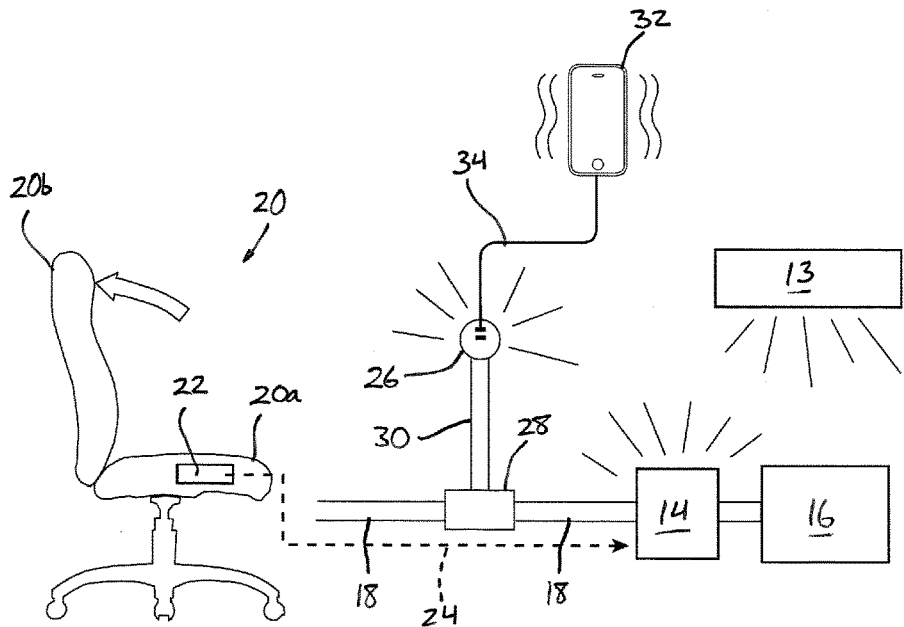
Figure 3A:
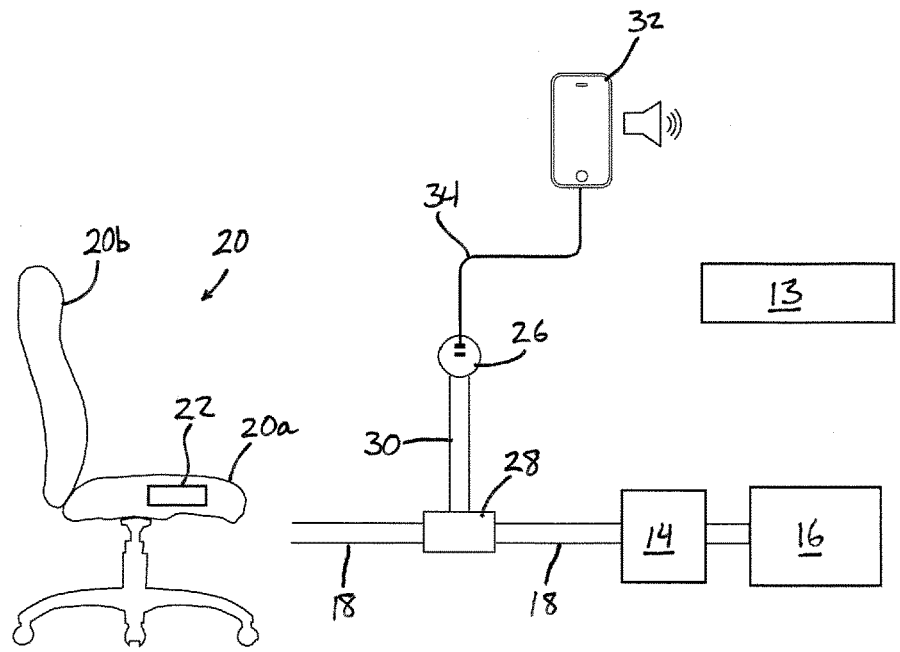
FIGS. 3A and 3B are diagrammatic views of the portion of the electrical power and data system of FIGS. 2A and 2B, shown in unoccupied and occupied modes with another portable chair.
Figure 3B:
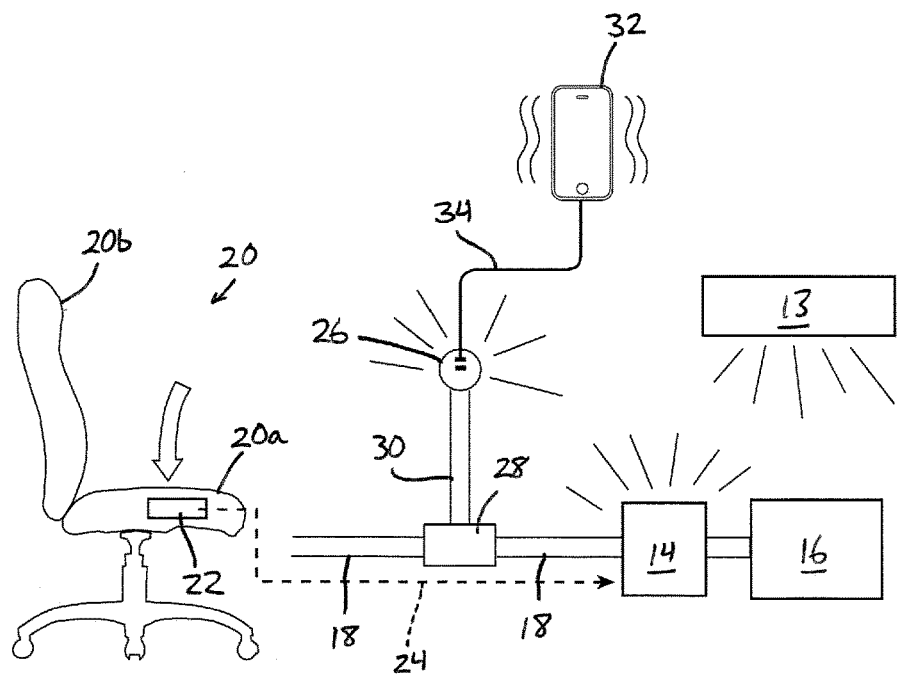
Figure 4A:
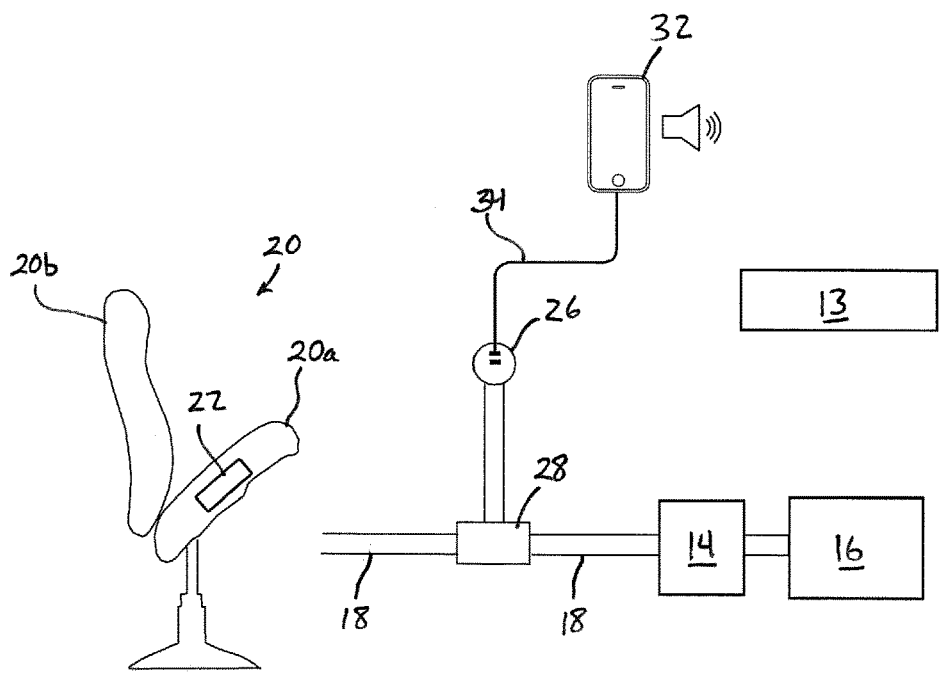
FIGS. 4A and 4B are diagrammatic views of the portion of the electrical power and data system of FIGS. 2A and 2B, shown in unoccupied and occupied modes with a single floor-mounted chair.
Figure 4B:
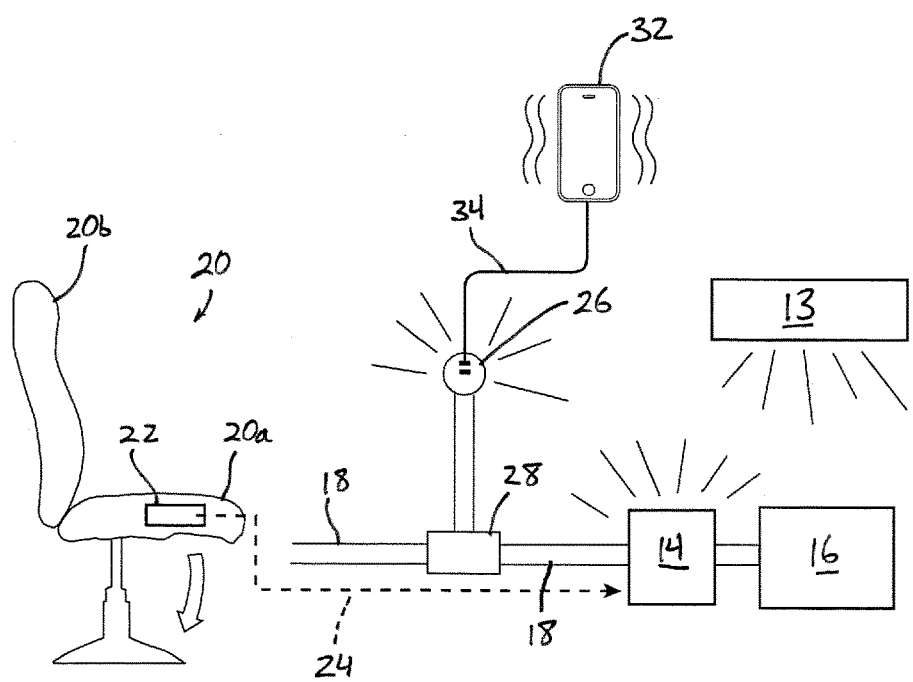

Optionally, and as shown in FIGS. 1-4B, each seat 20 has a seatback 20b associated with each seat bottom 20a. In FIG. 1 seats 20 are illustrated in a group seating arrangement such as in a vehicle or an auditorium, stadium, or arena. Seat bottoms 20a and seatbacks 20b may be in fixed positions, or seat bottoms 20a may be pivotable relative to seatbacks 20b. In the arrangements of FIGS. 2A, 2B, 4A and 4B, seat 20 is illustrated as a portable chair 20 (FIGS. 2A and 2B) or as a pedestal-mounted chair 20 (FIGS. 4A and 4B). In the arrangement of FIGS. 3A and 3B, seat 20 is illustrated as a portable chair having an occupancy sensor 20 in the form of a weight sensor, which detects that a load (indicated by a downward arrow in FIG. 3B) has been applied to seat bottom 20a and provides an occupancy signal 24 to combination DC power supply and controller 14.

Optionally, and instead of (or in addition to) an occupant weight sensor as shown in FIGS. 3A and 3B, it is envisioned that the position of seat bottom 20a and/or seatback 20b may be used to trigger the occupancy signal 24, such as shown in FIGS. 2A, 2B, 4A and 4B. For example, the portable chair 20 of FIGS. 2A and 2B has a pivoting seatback 20b and an occupancy sensor 22 located in seat bottom 20a. In this arrangement, occupancy sensor 22 provides an occupancy signal 24 to combination DC power supply and controller 14 when sensor 22 detects that seatback 20b has been raised (FIG. 2B). Detection of the raised seatback 20b may be accomplished using an angle sensor or a proximity sensor to trigger switch 27, for example. The pedestal-mounted chair 20 of FIGS. 4A and 4B has a pivoting seat bottom 20a that moves from a raised non-use position (FIG. 4A) to a lowered in-use position (FIG. 4B), which triggers occupancy sensor 22 and switch 27 to provide the occupancy signal 24 to combination DC power supply and controller 14 when sensor 22 detects that seat bottom 20a has been lowered.

Although the positioning of seatback 20b and seat bottom 20a may not be directly indicative of whether a given seat 20 is occupied by a user, the detected position of a seat component may be used to trigger the occupancy signal 24 in order to energize low voltage main line 18 and branch lines 30, and to establish two-way communications with electronic data network 13, such as shown in FIGS. 2B and 4B. Moreover, it is envisioned that springs, gas struts, or other biasing members may be used to automatically move the seatback 20b and/or seat bottom 20a to their non-use positions when unoccupied, so that the position of seatback 20b and/or of seat bottom 20a can be correlated directly to seat occupancy.

Low voltage main line 18 has a power input end 18a coupled to the low voltage DC output of DC power supply 14, and a downstream end 18b opposite the power input end 18a, such as shown in FIG. 1. The low voltage main line 18 includes at least two electrical power conductors, such as a positive polarity conductor and a negative polarity conductor, and may further include electronic communications capability such as via a twisted-pair data conductor line or a fiber optic line. The electrical power conductors of main line 18 may carry a first voltage, such as 24V DC or 48V DC, received from DC power supply 14, and supply that voltage (or a slightly reduced voltage, due to inherent losses along a length of conductor) to electrical power outputs 26 via respective splitters 28 and branch lines 30.

Typical handheld electronic communications devices 32 are charged using DC power supplied at approximately 2V DC to 18V DC, and more typically at about 5V DC to 12V DC. Therefore, it may be advantageous to provide higher voltage to electrical power outputs 26 via branch lines 30, and utilized a step-down circuit board (at electrical power output 26 or at the corresponding splitter 28) to reduce the voltage to a desired level at electrical power output 26. The step-down circuit board may include a power switch that is operable to energize and de-energize the electrical power output 26 in response to the occupancy signal 24 received from occupancy sensor 22, and which defaults to an open (de-energized) position when no occupancy signal 24 has been received for a predetermined amount of time.

Optionally, a main power switch 44 (FIG. 5) may be provided in DC power supply 14, instead of or in addition to power switches located in individual electrical power outputs 26 and/or splitters 28. Main power switch 44 is in communication, via a microprocessor including a BLE radio control 40, with each of the occupancy sensors 22 disposed along main line 18. In such an arrangement, it is envisioned that the main power switch 44 would close to energize main line 18 upon receiving occupancy signal 24 from any one of occupancy sensors 22 along main line 18. The main power switch 44 would open to de-energize main line 18 once no occupancy signal 24 has been received from any of the occupancy sensors 22 along that main line 18 for a predetermined amount of lapsed time. It is envisioned that the use of a main power switch 44 in this manner would result in a more energy-efficient system due to de-energizing of the main line 18, at least part of DC power supply 14, branch lines 30 and electrical power outputs 26 during times when none of the seats 20 are occupied.

In one embodiment, electronic communications are automatically established between the portable electronic communications device(s) 32 and the building's or vehicle's electronic data network 13, once a device 32 is physically connected to one of the electrical power outputs 26, via an electronic signal or data line (not shown) that extends from each electrical power output 26 to DC power supply 14 via the corresponding branch line 30 and main line 18. In an alternative embodiment, electronic communications are established between the portable electronic communications device(s) 32 and the building's or vehicle's electronic data network 13 via wireless communications protocols. It is envisioned that electrical power outputs 26 may be direct-contact electrical connectors/receptacles for receiving a plug or other type of connection interface, typically having a cord 34 extending to portable electronic communication device 32. Such connectors/receptacles have electrical power contacts and, optionally, electronic data contacts, such as found in common USB power/data connectors. However, it will be appreciated that wireless charging technologies such as inductive power couplings may be used, such that no wires and no direct-contact electrical connectors are required. Wireless data communications between portable electronic communication devices 32, electrical power and data system 10, and the building's or vehicle's electronic data network 13, may be conducted using any suitable wireless communications protocol such as 2.4 GHz ZIGBEE® protocol, BLUETOOTH® protocol, near field communications (NFC), or WiFi communications.

Figure 5:
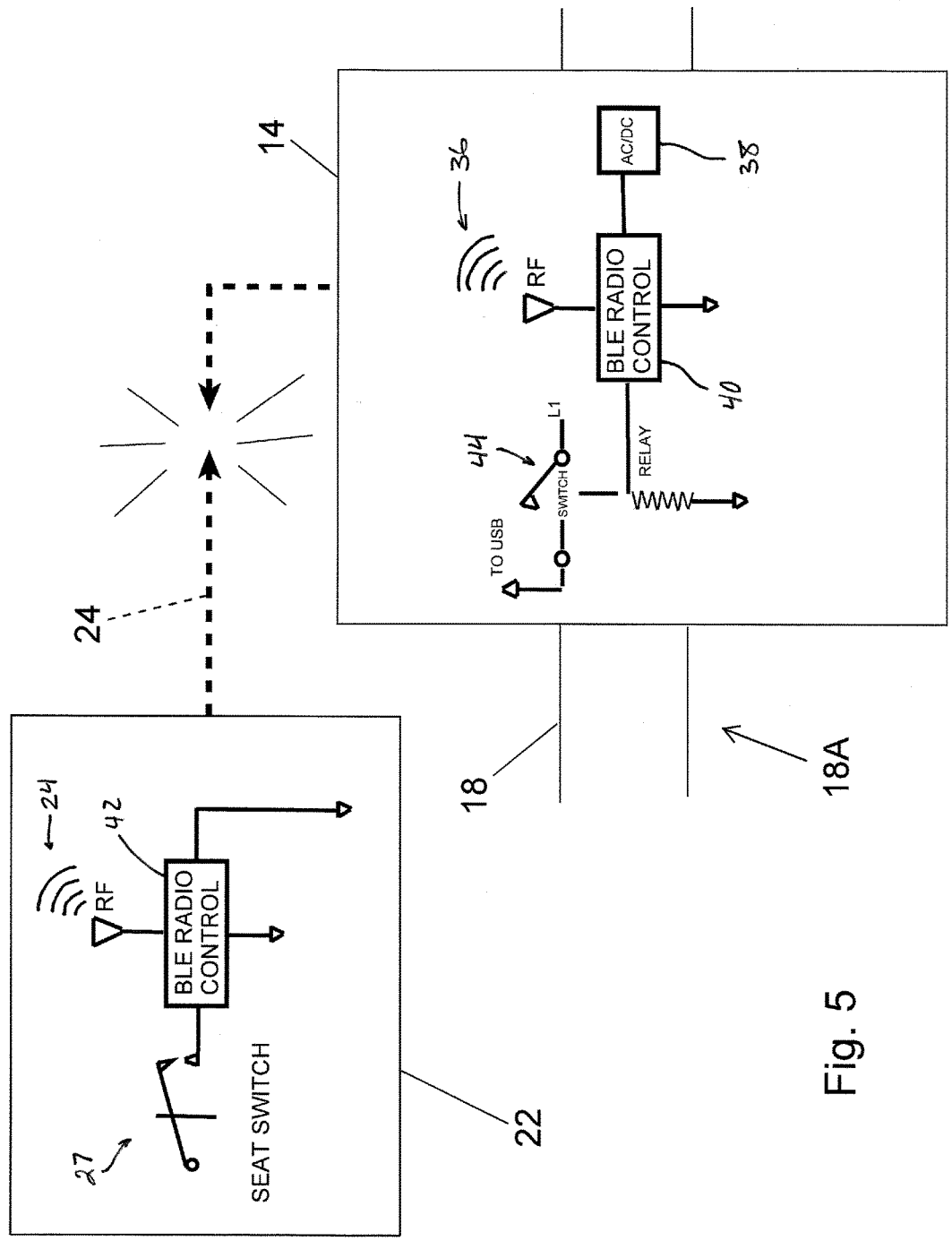
FIG. 5 is an electrical diagram depicting general circuitry and communications between an occupancy sensor and a combination DC power supply and controller of the electrical power and data system of FIG. 1.

Combination DC power supply and controller 14 may be equipped for wired and/or wireless electronic data communications 36 with the building's or vehicle's electronic data network 13, such as shown in FIGS. 1 and 5. An optional AC-to-DC power converter 38 receives high voltage AC power from AC power source 16 and supplies low voltage DC power to a microprocessor including a BLE radio control 40 (FIG. 5). The microprocessor with BLE radio control 40 manages communications with seat occupancy sensors 22, which include their own BLE radio controls 42. The microprocessor with BLE radio control 40 may also manage communications with controllers (not shown) that are associated with the electrical power outputs 26. Combination DC power supply and controller 14 may include main power switch 44 that is operable, in response to the associated BLE radio control 40, to energize and de-energize main line 18 as described above. BLE radio control 40 may also be operable to activate and de-activate AC-to-DC power converter 38, provided that BLE radio control 40 can be energized by a power source (such as AC power source 16 or an onboard battery) that is independent of AC-to-DC power converter 38.

Once a wired or wireless electrical connection and initial data connection are established between portable electronic communications device 32 and electrical power and data system 10, device 32 may display a permission authorization message to the user, requesting the user to confirm whether the device 32 is authorized to exchange data with electrical power and data system 10 and, by extension, with the building's or vehicle's electronic data network 13. Such permissions may allow limited network control of the user's device 32, such as automatically switching the device 32 into a silent or vibration-alert mode when connected to electrical power and data system 10. This may be particularly useful when electrical power and data system 10 is installed in a movie theater or auditorium, where patrons are asked or required to silence their phones and other portable electronic devices. By further example, limited network control of the user's device 32 may include automatically switching the device 32 into "airplane mode" in which wireless communications are prevented or restricted, such as for an electrical power and data system installed in a commercial aircraft.

It is envisioned that the types of data that may be exchanged between one or more of portable electronic communications device 32, electrical power and data system 10, and the building's or vehicle's electronic data network 13, may include or permit the calculation and monitoring of various parameters including (i) electrical power consumption, (ii) current seat occupancy status and occupancy rates or averages over time, (iii) whether any seats are never being used, which could be indicative of a damaged seat in need of repair, (iv) frequency with which electrical power outputs 26 are being used by patrons, (v) in the case of seating areas with assigned seating, whether a given seat 20 is being occupied by a specifically-assigned user, and (vi) the number of occupied seats 20 in a seating area 12 compared to the number of tickets sold (or reservations made) in that seating area 12.

In addition, in some embodiments of electrical power and data system 10, users of portable electronic communications devices 32 may opt to receive event-specific information from electrical power and data system 10 and the building's or vehicle's electronic data network 13 to their devices 32 while connected to electrical power outputs 26. Event-specific or venue-specific information may include, for example, a food and beverage menu (optionally, with ordering and/or payment capability) for the venue, player and team statistics during a sporting event, notifications regarding randomly selected seat prizes, information about actors, settings, and production information during a movie or theatrical production, and the like.

Thus, the electrical power and data system of the present invention allows the operator of a venue, a passenger vehicle, or a work area to supply electrical charging power to the portable electronic communications devices of users in a group seating area of a venue such as a theater, arena, stadium, or restaurant, or in a vehicle such as a train, aircraft, ship, or bus. The charging capability is provided on-demand, such as based on signals received from seat occupancy sensors, with electrical power outlets (either wireless or direct-contact) de-energized when not in use, thus reducing the amount of electrical energy wasted.

Once an electrical charging connection is established between a user's portable electronic communications device and the electrical power and data system, the system may establish electronic data communications between the portable device and the electronic data network of the building, venue, or vehicle in which the system and device are located. These electronic data communications may be used to provide useful information to the user of the portable electronic device, may be used to control certain functions of the user's device such as temporarily disabling audible ringers, and may be used by the operator of the electronic data network of the building, venue, or vehicle to collect information about seat utilization and power consumption, for example.

Changes and modifications in the specifically-described embodiments may be carried out without departing from the principles of the present invention, which is intended to be limited only by the scope of the appended claims as interpreted according to the principles of patent law including the doctrine of equivalents.

The embodiments of the invention in which an exclusive property or privilege is claimed are defined as follows:

1. An electrical power and data system for a group seating area, said electrical power and data system comprising:
    an electrical power supply;
    a plurality of occupancy sensors positionable at respective seats in the group seating area, wherein said occupancy sensors are each operable to generate a respective occupancy signal that is indicative of the occupancy status of the respective seat;
    a main power line having a power input end electrically coupled to said electrical power supply and a downstream end opposite said power input end, said main power line comprising at least two electrical power conductors;
    a plurality of branch power lines in spaced arrangement along said main line and electrically coupled to said main power line, said branch power lines each having an electrical power output configured to supply electrical power to a portable electronic communications device, wherein said electrical power outputs are each positionable at the seating area and are accessible from at least one of the seats; and
    a controller in electronic communication with said occupancy sensors and with an electronic data network associated with the group seating area, said controller comprising a switch that is operable to selectively energize one or more of said electrical power outputs in response to receiving one or more of the occupancy signals;

wherein said controller is operable to establish two-way electronic communications between one or more of the portable electronic communications devices and the electronic data network in response to the one or more portable electronic communications devices receiving electrical power from a respective one or more of said electrical power outputs.

2. The electrical power and data system of claim 1, wherein said branch power line and said main power line are operable to provide the two-way electronic communications between one or more of the portable electronic communications devices and the electronic data network.

3. The electrical power and data system of claim 2, wherein said branch power line and said main power line each comprise an electronic signal line for providing the two-way electronic communications between one or more of the portable electronic communications devices and the electronic data network.

4. The electrical power and data system of claim 3, wherein said electronic signal line comprises at least one chosen from (i) a twisted pair of electronic data conductors, and (ii) a fiber optic line.

5. The electrical power and data system of claim 1, wherein said electrical power supply comprises a low voltage DC power supply.

6. The electrical power and data system of claim 5, wherein said low voltage DC power supply is operable to receive an AC voltage input and to convert the AC voltage input to a DC low voltage output.

7. The electrical power and data system of claim 1, wherein said electrical power outputs comprise direct-contact electrical receptacles each configured to be engaged by an electrical plug associated with the portable electronic device.

8. The electrical power and data system of claim 7, wherein said branch power line and said main power line each comprise an electronic signal line for providing the two-way electronic communications between one or more of the portable electronic communications devices and the electronic data network, and wherein said direct-contact electrical receptacles comprise electronic data interfaces configured to be engaged by a corresponding electronic data interface of the electrical plug associated with the portable electronic device.

9. The electrical power and data system of claim 7, wherein said electrical power outputs comprise respective voltage reduction circuits operable to receive a first voltage from said branch line and to output a second voltage that is lower than the first voltage to said direct-contact electrical receptacles.

10. The electrical power and data system of claim 1, wherein said electrical power output comprises said switch and said controller, and wherein said controller is in wireless electronic communication with said occupancy sensor.

11. The electrical power and data system of claim 1, wherein said electrical power supply comprises said controller and said switch, and wherein said switch is operable to energize and de-energize said main power line.

12. The electrical power and data system of claim 1, wherein said occupancy sensor comprises a seat pressure sensor or a seat angle sensor.

13. The electrical power and data system of claim 1, wherein each of said electrical power outputs of each of said branch lines is in wireless electronic communication with a respective one of said occupancy sensors, and wherein said electrical power outputs are selectively individually energized in response to the occupancy signal received from said respective one of said occupancy sensors.

14. The electrical power and data system of claim 13, wherein said electrical power outputs are de-energized in response to a predetermined amount of lapsed time after a respective one of the occupancy signals was last received from said respective one of said occupancy sensors.

15. An electrical power and data system for a group seating area, said electrical power and data system comprising:

a DC power supply operable to receive an AC voltage input and to convert the AC voltage input to a DC voltage output;

a controller in communication with said DC power supply and operable to selectively energize said DC power supply;

a low voltage DC electrical main power line having a proximal power input end and a distal end opposite said proximal power input end, wherein said proximal power input end is coupled to said DC voltage output of said DC power supply;

a plurality of splitters disposed in spaced arrangement along said main power line, said splitters each having a main input end disposed toward said proximal power input end of said main power line, a main output end disposed toward said distal end of said main power line, and a branch output end in electrical communication with said main line;

a plurality of branch power lines having respective branch proximal ends coupled to said branch output ends of respective ones of said splitter, said branch power lines having respective branch distal ends spaced from said branch proximal ends;

an electrical receptacle at each of said branch distal ends and configured to be engaged by an electrical connector associated with a hand-held electronic communications device, wherein said electrical receptacles are accessible from respective seats in the group seating area; and an occupancy sensor disposed in each seat of the seating area, wherein said occupancy sensors are in communication with said controller and said occupancy sensors are operable to generate respective occupancy signals indicative of the occupancy status of the respective seats;

wherein said controller is operable to energize said DC power supply to thereby electrically energize said main power line in response to receiving one of said occupancy signals from any one of said occupancy sensors.

16. The electrical power and data system of claim 15, wherein said electrical receptacles are individually selectively energizable by said controller in response to said controller receiving one or more of said occupancy signals from one or more of said occupancy sensors.

17. The electrical power and data system of claim 15, wherein said occupancy sensors comprise seat pressure sensors or seat angle sensors.

18. The electrical power and data system of claim 15, wherein said controller is in electronic communication with an electronic data network associated with the group seating area, and said controller is operable to establish two-way electronic communications between one or more of the portable electronic communications devices and the electronic data network in response to the one or more portable electronic communications devices receiving electrical power from a respective one or more of said electrical receptacles.

19. The electrical power and data system of claim 18, wherein said branch power line and said main power line each comprise an electronic signal line for providing the two-way electronic communications between the one or more of the portable electronic communications devices and the electronic data network.

20. A method of electrically charging portable electronic communications devices and establishing two-way electronic communications between the portable electronic communications devices and an electronic data network in a group seating area, said method comprising:

positioning one of the portable electronic communications devices so as to be capable of receiving electrical charging power from an electrical power output associated with a seat in the group seating area;

detecting seat occupancy with an occupancy sensor disposed in the seat in the group seating area, wherein the occupancy sensor is operable to detect at least one of seat pressure and seat angle;

generating an occupancy signal with the occupancy sensor upon said detecting seat occupancy;

receiving the occupancy signal with a controller associated with at least one of the electrical power output and an electrical power supply, wherein the electrical power supply is operable to supply electrical power to the electrical power output via a main power line and a branch power line corresponding to the seat and in electrical communication with the main power line;

electrically energizing the electrical power output in response to said receiving the occupancy signal to thereby provide the electrical charging power to the portable electronic communications device; and establishing two-way electronic communications between the portable electronic communications device and the electronic data network in response to said receiving the occupancy signal and said electrically energizing the electrical power output.

\* \* \* \* \*